US009741490B2

(12) United States Patent
Cha et al.

(10) Patent No.: US 9,741,490 B2
(45) Date of Patent: Aug. 22, 2017

(54) POWER INDUCTOR AND MANUFACTURING METHOD THEREOF

(71) Applicant: Samsung Electro-Mechanics, Co., Ltd., Suwon-si, Gyeonggi-do (KR)

(72) Inventors: Hye Yeon Cha, Suwon-si (KR); Young Do Kweon, Suwon-si (KR); Young Seuck Yoo, Suwon-si (KR); Hwan Soo Lee, Suwon-si (KR); Woon Chul Choi, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/175,478

(22) Filed: Feb. 7, 2014

(65) Prior Publication Data

US 2014/0247101 A1 Sep. 4, 2014

(30) Foreign Application Priority Data

Mar. 4, 2013 (KR) ........................ 10-2013-0022706

(51) Int. Cl.

*H01F 5/00* (2006.01)
*H01F 7/06* (2006.01)
*H01L 21/302* (2006.01)
*H01F 41/12* (2006.01)
*H01F 27/28* (2006.01)
*H01F 41/04* (2006.01)
*H01F 27/32* (2006.01)

(52) U.S. Cl.

CPC ......... *H01F 41/12* (2013.01); *H01F 27/2804* (2013.01); *H01F 41/042* (2013.01); *H01F 27/327* (2013.01); *H01F 41/127* (2013.01); *H01F 2027/2809* (2013.01); *Y10T 29/4902* (2015.01)

(58) Field of Classification Search

CPC ............... H01F 27/2804; H01F 27/292; H01F 17/0006; H01F 41/041; H01F 2017/0086
USPC .......... 336/200; 29/602.1; 257/531; 438/669
See application file for complete search history.

(56) References Cited

U.S. PATENT DOCUMENTS 6,030,877 A * 2/2000 Lee ........................ H01L 27/08 257/295
6,436,816 B1 * 8/2002 Lee ........................ C23C 18/36 257/E21.174
6,475,812 B2 * 11/2002 Nickel .................. B82Y 10/00 257/E21.665

(Continued)

FOREIGN PATENT DOCUMENTS

JP 2007-257747 A 10/2007

*Primary Examiner* — Alexander Talpalatski
*Assistant Examiner* — Joselito Baisa
(74) *Attorney, Agent, or Firm* — McDermott Will & Emery LLP

(57) ABSTRACT

Disclosed herein are a power inductor in which aspect ratios of the innermost pattern and the outermost pattern are similar with those of the intermediate pattern and a manufacturing method thereof. The power inductor includes coil patterns formed on one surface or both surfaces of a core insulating layer; insulating patterns bonded to at least one of an innermost pattern and an outermost pattern of the coil patterns; metal layers plated on surfaces of the coil patterns; and an insulator covering the coil patterns including the metal layers.

8 Claims, 6 Drawing Sheets

(56) References Cited

U.S. PATENT DOCUMENTS

| | | | | | |
|---|---|---|---|---|---|
| 6,600,404 | B1 * | 7/2003 | Kajino | H01F 5/003 | 257/531 |
| 6,847,066 | B2 * | 1/2005 | Tahara | H01L 23/3114 | 257/243 |
| 7,216,419 | B2 * | 5/2007 | Kusano | H01F 17/0006 | 29/592.1 |
| 7,221,250 | B2 * | 5/2007 | Yoshida | H01F 27/2804 | 336/200 |
| 7,253,521 | B2 * | 8/2007 | Ahn | H01L 21/28512 | 257/751 |
| 7,389,576 | B2 * | 6/2008 | Na | G01R 33/05 | 205/119 |
| 7,928,576 | B2 * | 4/2011 | Lin | H01L 23/48 | 257/690 |
| 7,960,269 | B2 * | 6/2011 | Lo | H01L 21/2885 | 257/777 |
| 2012/0126926 | A1 * | 5/2012 | Kroener | H01F 27/2804 | 336/199 |

* cited by examiner

[FIG. 1]
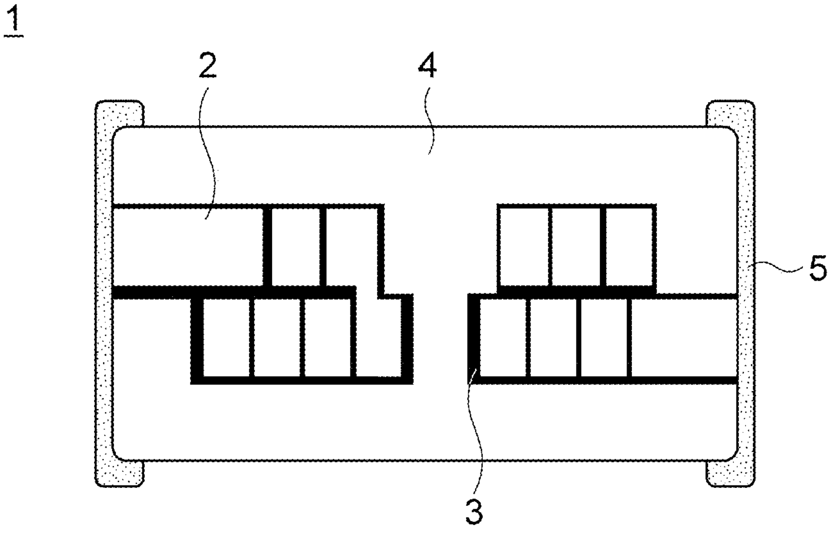
- PRIOR ART-
[FIG. 2A]
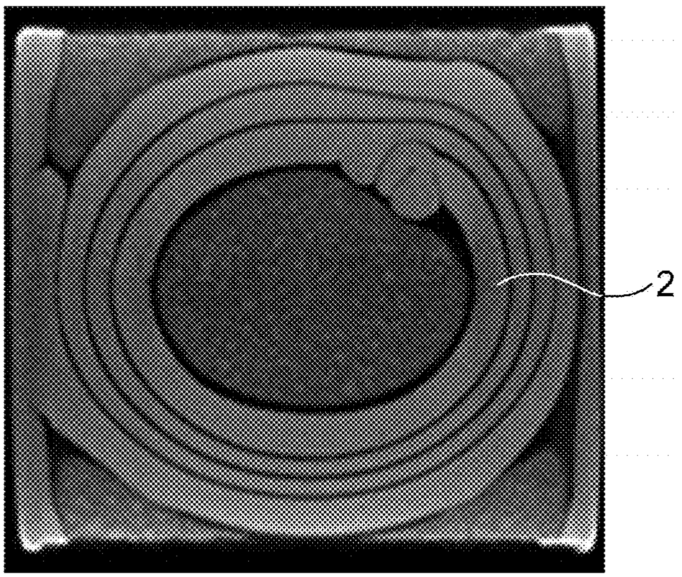
- PRIOR ART-

[FIG. 2B]
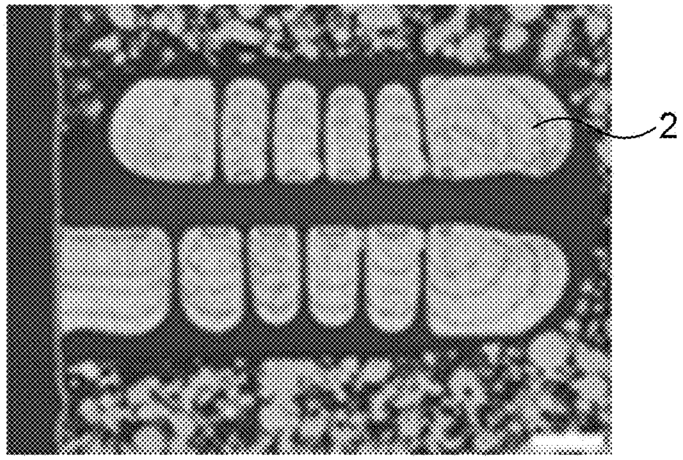
- PRIOR ART-
[FIG. 3]
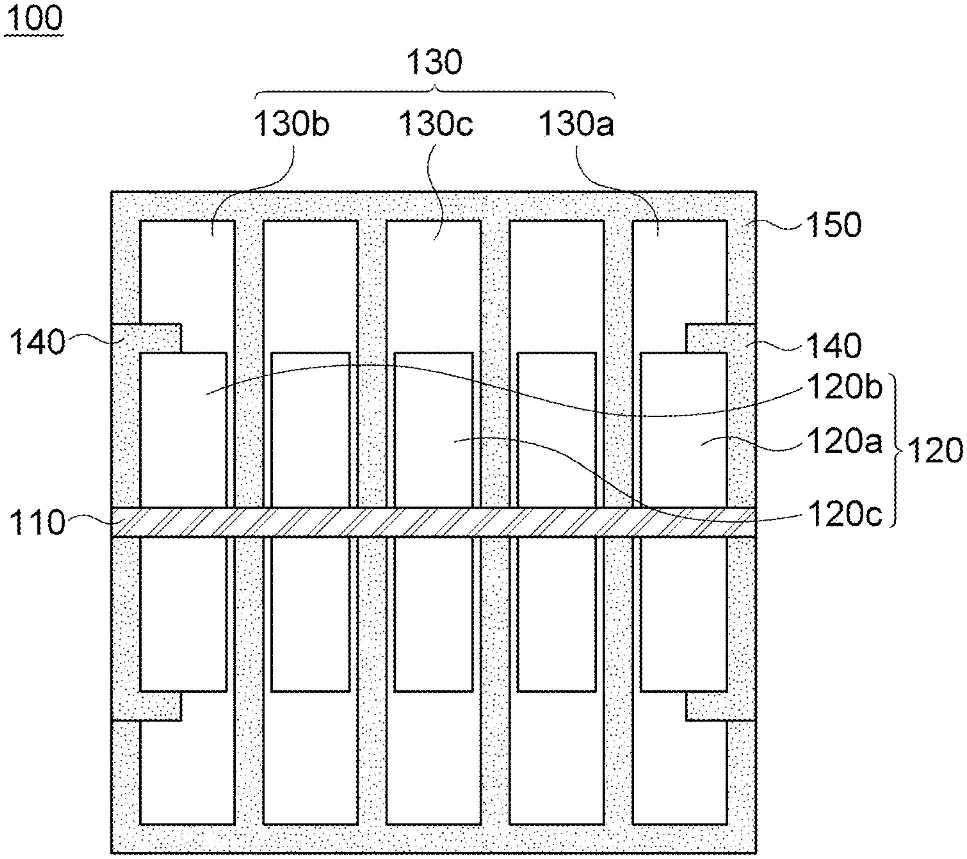

[FIG. 4]
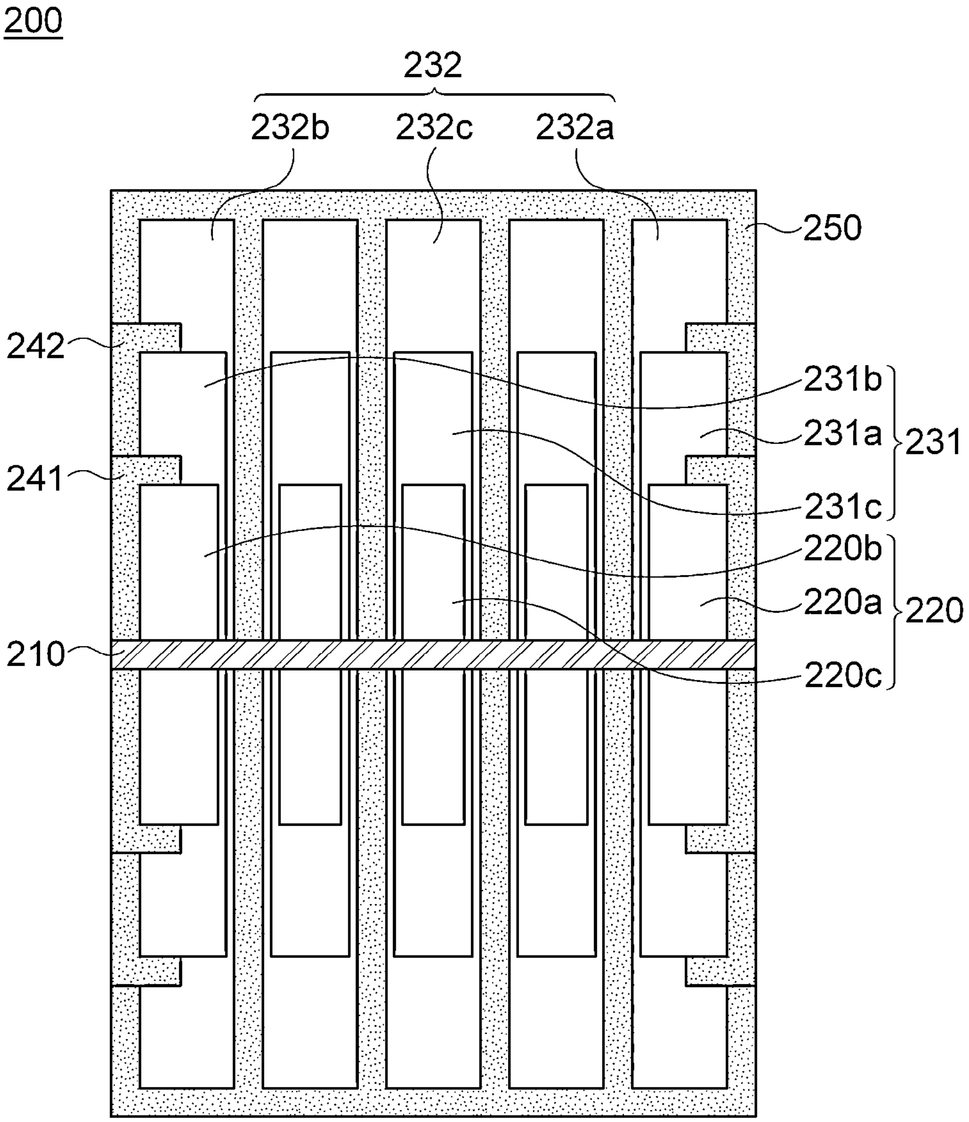

[FIG. 5]
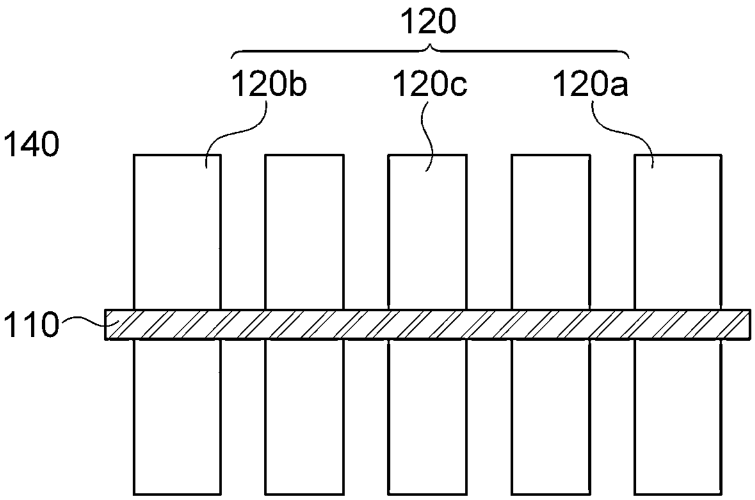
[FIG. 6]
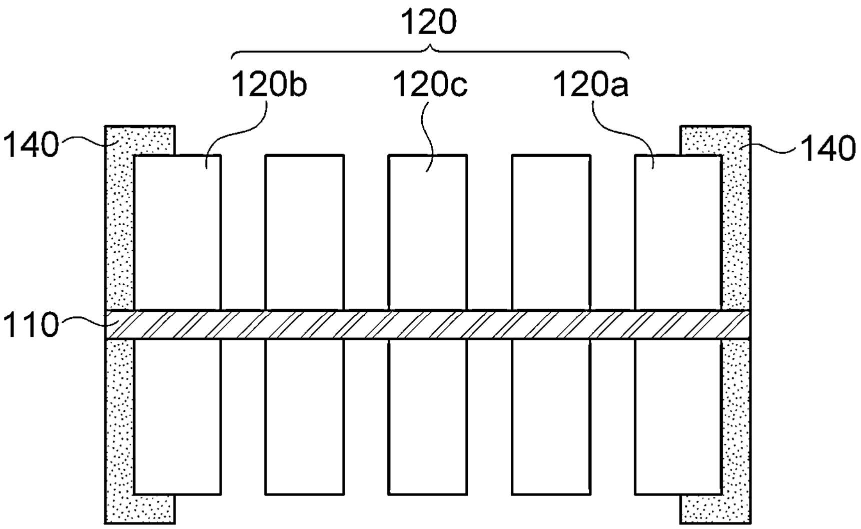

[FIG. 7]
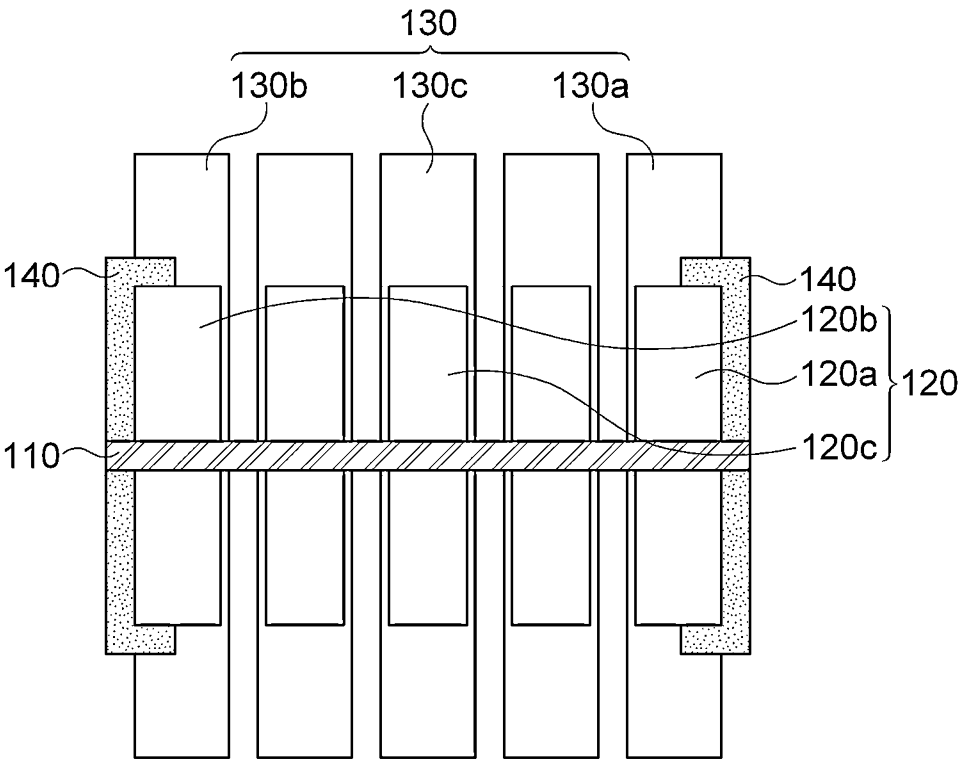

[FIG. 8]
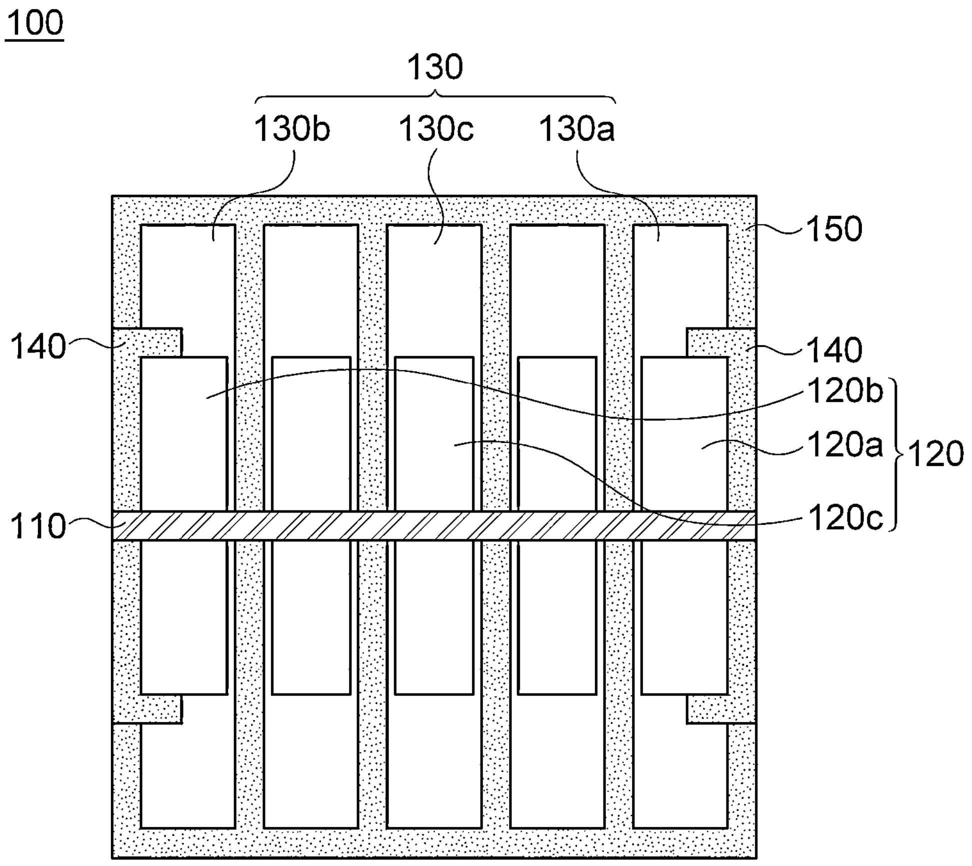

POWER INDUCTOR AND MANUFACTURING METHOD THEREOF

CROSS REFERENCE(S) TO RELATED APPLICATIONS

This application claims the benefit under 35 U.S.C. Section 119 of Korean Patent Application Serial No. 10-2013-0022706, entitled "Power Inductor and Manufacturing Method Thereof" filed on Mar. 4, 2013, which is hereby incorporated by reference in its entirety into this application.

BACKGROUND OF THE INVENTION

1. Technical Field

The present invention relates to a power inductor and a manufacturing method thereof, and more particularly, to a coil pattern structure included in the power inductor.

2. Description of the Related Art

As information technologies advance, devices are getting smaller and thinner, and, accordingly, demands for smaller and thinner elements are also increasing. In accordance with the above trend, a power inductor, which is a type of surface mounted device, is developed to have a thin film structure.

FIG. 1 is a longitudinal cross-sectional view of a typical thin film power inductor, and FIGS. 2A and 2B are photographs showing a transverse cross-sectional view and a longitudinal cross-sectional view of a typical thin film power inductor.

Referring to FIG. 1, the typical thin film power inductor 1 is configured so that an electrode 2 having metal coil patterns therein is surrounded by an insulator 3 and the vicinity is filled with metal-polymer mixture 4 so as to facilitate magnetic flux flow. The electrode 2 having metal coil patterns therein is connected to an external electrode 5.

FIG. 2A shows a longitudinal cross-sectional surface of a typical thin film power inductor, and FIG. 2B shows a transverse cross-sectional surface of the typical thin film power inductor. Referring to FIGS. 2A and 2B, generally when forming inner coils 2, the aspect ratios (=plating height/plating width) at the innermost side and the outermost side are lower than those of intermediate coil patterns because the progressing direction at the innermost side and the outermost side are not defined.

Patent Document 1 discloses a method for forming conductor patterns including stacking a first conductive layer on a magnetic head, bonding a resist pattern, performing electrolyte plating to form a conductive pattern in an opening, and delaminating the resist, such that conductor patterns have the same aspect ratios. However, the method is related to the first electrolyte plating, and still has a problem with the second electrolyte plating in that the progressing direction of plating at the innermost side and the outermost side is not defined.

RELATED ART DOCUMENT

Patent Document (Patent Document 1) Japanese Patent Laid-open Publication No. 2007-257747

SUMMARY OF THE INVENTION

An object of the present invention is to provide a power inductor having high inductance and a manufacturing method thereof, in which the innermost coil pattern and the outermost coil pattern also have similar shapes with the intermediate coil patterns unlike the existing coil patterns, such that areas of the metal-polymer filled in the innermost coil pattern and the outermost coil pattern are increased. By doing so, the performance (inductance) of the power inductor is improved and low direct current resistance is achieved.

According to an exemplary embodiment of the present invention, there is provided a power inductor including: coil patterns formed on one surface or both surfaces of a core insulating layer; insulating patterns bonded to at least one of an innermost pattern and an outermost pattern of the coil patterns; metal layers plated on surfaces of the coil patterns; and an insulator covering the coil patterns including the metal layers.

The insulating pattern bonded to the innermost pattern may be formed on an inner surface of the innermost pattern, and the insulating pattern bonded to the outermost pattern may be formed on an outer surface of the outermost pattern.

The insulating pattern bonded to the inner surface of the innermost pattern may be extended to an upper surface of the innermost pattern.

The insulating pattern bonded to the outer surface of the outermost pattern may be extended to an upper surface of the outermost pattern.

The metal layers may be anisotropically plated through the plating process using the coil patterns as lead-in lines.

According to another exemplary embodiment of the present invention, there is provided a power inductor including: coil patterns formed on one surface or both surfaces of a core insulating layer; first insulating patterns each bonded to at least one of an innermost pattern and an outermost pattern of the coil patterns; first metal layers plated on surfaces of the coil patterns; second insulating patterns each bonded to at least one of the first metal layers plated on the innermost pattern and the outermost pattern; second metal layers plated on surfaces of the first metal layers; and an insulator covering the coil patterns including the first and second metal layers.

The first insulating pattern bonded to the innermost pattern may be formed on an inner surface of the innermost pattern, and the second insulating pattern bonded to the first metal layers plated on the surface of the innermost pattern may be formed on inner surfaces of the first metal layers plated on the surface of the innermost pattern.

The first insulating pattern bonded to the outermost pattern may be formed on an outer surface of the outermost pattern, and the second insulating pattern bonded to the first metal layers plated on the surface of the outermost pattern may be formed on outer surfaces of the first metal layers plated on the surface of the outermost pattern.

According to an exemplary embodiment of the present invention, there is provided a manufacturing method of a power inductor, the method including: forming coil patterns on one surface or both surfaces of a core insulating layer; forming insulating patterns each bonded to at least one of an innermost pattern and an outermost pattern of the coil patterns; plating metal layers on surfaces of the coil patterns; and forming an insulator covering the coil patterns including the metal layers.

In the forming of the insulating pattern bonded to the innermost pattern, the insulating pattern may be formed on an inner surface of the innermost pattern, and in the forming of the insulating pattern bonded to the outermost pattern, the insulating pattern may be formed on an outer surface of the outermost pattern.

The insulating pattern bonded to the inner surface of the innermost pattern may be extended to an upper surface of the innermost pattern.

The insulating pattern bonded to the outer surface of the outermost pattern may be extended to an upper surface of the outermost pattern.

The plating of the metal layers may be performed through a plating process using the coil patterns as lead-in lines.

These and other aspects, features and advantages will become apparent from the accompanying claims and the detailed descriptions.

BRIEF DESCRIPTION OF THE DRAWINGS

FIG. 1 is a longitudinal cross-sectional view of a typical thin film power inductor;

FIGS. 2A and 2B are photographs showing a transverse cross-sectional view and a longitudinal cross-sectional view of a typical thin film power inductor, respectively;

FIG. 3 is a cross-sectional view of a chip for illustrating a coil pattern structure included in a power inductor according to an exemplary embodiment of the present invention;

FIG. 4 is a cross-sectional view of a chip for illustrating a coil pattern structure included in a power inductor according to another exemplary embodiment of the present invention; and FIGS. 5 to 8 are views sequentially showing processes of a manufacturing method of a power inductor according to an exemplary embodiment of the present invention.

DESCRIPTION OF THE PREFERRED EMBODIMENTS

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art.

Terms used in the present specification are for explaining exemplary embodiments rather than limiting the present invention. Unless explicitly described to the contrary, a singular form includes a plural form in the present specification. Throughout this specification, the word “comprise” and variations such as “comprises” or “comprising,” will be understood to imply the inclusion of stated constituents, steps, operations and/or elements but not the exclusion of any other constituents, steps, operations and/or elements.

FIG. 3 is a cross-sectional view of a chip for illustrating a coil pattern structure included in a power inductor according to an exemplary embodiment of the present invention. Additionally, components shown in the accompanying drawings are not necessarily shown to scale. For example, sizes of some components shown in the accompanying drawings may be exaggerated as compared with other components in order to assist in the understanding of the exemplary embodiments of the present invention.

In the power inductor device 100 according to the exemplary embodiment of the present invention, coil patterns 120 are formed on one surface or both surfaces of a core insulating layer 110, metal layers 130 are plated on the surface, and the coil patterns 120 including the metal layers 130 are covered by an insulator 150.

The coil patterns 120 are plated lines printed on the surface of the core insulating layer 110 in the form of coils, and the coil patterns 120 shown in FIG. 3 correspond to the patterns located at the left side of the coil center. Accordingly, hereinafter, “the innermost pattern 120*a*” refers to the closest pattern from the coil center and is located on the right most side of the drawing, whereas “the outermost pattern 120*b*” refers to the farthest pattern from the coil center and is located on the left most side of the drawing.

It is apparent that the innermost pattern 120*a* and the outermost pattern 120*b* may be changed if the coil patterns 120 shown in FIG. 3 correspond to the patterns located at the right side of the coil center.

Insulating patterns 140 may be bonded to at least one of the innermost pattern 120*a* and the outermost pattern 120*b*. Specifically, the insulating pattern 140 bonded to the innermost pattern 120*a* may be formed on the inner surface of the innermost pattern 120*a*, whereas the insulating pattern 140 bonded to the outermost pattern 120*b* may be formed on the outer surface of the outermost pattern 120*b*.

Here, the inner surface of the innermost pattern 120*a* refers to the surface facing the coil center among the two surfaces of the innermost pattern 120, whereas the outer surface of the outermost pattern 120*b* refers to the surface facing outside among the two surfaces of the outermost pattern 120*b*. That is, the insulating patterns 140 are bonded to the surfaces of the innermost pattern 120*a* and the outermost pattern 120*b* that do not have adjacent patterns (referred hereinafter to as intermediate patterns, 120*c*).

The metal layers 130 are formed by the plating process using the coil patterns 120 as lead-in lines, among others, for the metal layer 130*c* formed on the surface of the intermediate pattern 120*c*, plating in the width direction is suppressed by adjacent patterns, such that the metal layer 130*c* is anisotropically plated mainly in the height direction.

Further, for the metal layer 130*a* formed on the surface of the innermost pattern 120*a*, plating in the width direction is suppressed by the adjacent intermediate pattern 120*c* on the left surface of the innermost pattern 120*a*, and, plating in the width direction is suppressed by the insulating patterns 140 bonded to the inner surface on the right surface, i.e., the inner surface, such that the metal layer 130*a* is anisotropically plated mainly in the height direction.

Likewise, plating in the width direction is suppressed by the adjacent intermediate pattern 120*c* on the right surface of the outermost pattern 120*b*, and plating in the width direction is suppressed by the insulating patterns 140 bonded to the outer surface on the left surface, i.e., the outer surface, such that the metal layer 130*b* is anisotropically plated mainly in the height direction.

As described above, in the power inductor 100 according to the exemplary embodiment of the present invention, the metal layers 130 are anisotropically plated even in the innermost pattern 120*a* and outermost pattern 120*b* as well as the intermediate pattern 120*c*, such that the aspect ratios (height/width of plating) of patterns may be implemented at a predetermined value or more, thereby greatly improving the performance of the power inductor.

In addition, in order to prevent the metal layers 130*a* and 130*b* from being plated to the side surfaces of the insulating patterns 140, the insulating pattern 140 bonded to the inner surface of the innermost pattern 120*a* may be extended to the upper surface of the innermost pattern 120*a*. Likewise, the insulating pattern 140 bonded to the outer surface of the outermost pattern 120*b* may be extended to the upper surface of the outermost pattern 120*b*.

Since the insulating pattern 140 formed on the upper surface of the innermost pattern 120*a* or the outermost pattern 120*b* disturbs the flow of the plating, by appropriately setting the length of the insulating pattern 140 formed on the upper surface, it may be possible to prevent the metal layers 130*a* and 130*b* from being overly plated.

Thus far, the structure in which metal layers 130 are plated one time on the coil patterns 120 has been described. However, in order to increase the aspect ratios of the patterns, the metal layers 130 may be repeatedly plated multiple times. In this case, the insulating patterns 140 may also be repeatedly formed.

For example, FIG. 4 is a cross-sectional view of a chip for illustrating a coil pattern structure according to another exemplary embodiment of the present invention. In contrast to FIG. 3, in a power inductor 200 shown in FIG. 4, metal layers may include first metal layers 231 and second metal layers 232, and insulating patterns may include first insulating patterns 241 and second insulating patterns 242.

Specifically, in the power inductor 200 according to another exemplary embodiment of the present invention, coil patterns 220 are formed on one surface or both surfaces of a core insulating layer 210, first metal layers 231 are plated on the surface, the second metal layers 232 are plated on the surfaces of the first metal layers 231, and the coil patterns 220 including the first and second metal layers 231 and 232 are covered by an insulator 250.

The first insulating patterns 241 may be bonded to at least one of the innermost pattern 220*a* and the outermost pattern 220*b* of the coil patterns 220.

Specifically, the first insulating pattern 241 bonded to the innermost pattern 220*a* may be formed on the inner surface of the innermost pattern 220*a*, whereas the first insulating pattern 241 bonded to the outermost pattern 220*b* may be formed on the outer surface of the outermost pattern 220*b*.

Further, the second insulating pattern 242 may be bonded to at least one of the first metal layer 231*a* plated on the surface of the innermost pattern 220*a* and the first metal layer 231*b* plated on the surface of the outermost pattern 220*b*.

Specifically, the second insulating pattern 242 bonded to the first metal layer 231*a* may be formed on the inner surface of the first metal layer 231*a* so as to be connected to the first insulating pattern 241 under the second insulating pattern 242. Likewise, the second insulating pattern 242 bonded to the first metal layer 231*b* may be formed on the outer surface of the first metal layer 231*b* so as to be connected to the first insulating pattern 241 under the second insulating pattern 242.

In the power inductor 200 shown in FIG. 4, the first metal layer 231 is formed by the plating process using the coil patterns 220 as lead-in lines, whereas the second metal layers 232 are formed by the plating process using the first metal layers 231 as lead-in layers.

Here, for the left surface of the innermost pattern 220*a*, plating in the width direction is suppressed by the adjacent intermediate pattern 220*c*, and for the right surface, i.e., the inner surface, plating in the width direction is suppressed by the first insulating pattern 241 bonded to the inner surface, such that the first metal layer 231*a* is anisotropically plated mainly in the height direction.

Further, for the second metal layer 232*a* formed on the surface of the first metal layer 231*a*, plating in the width direction is suppressed by the adjacent first metal layer pattern 231*c* on the left surface of the first metal layer 231*a*, and plating in the width direction is suppressed by the second insulating patterns 242 bonded to the inner surface on the right surface, i.e., the inner surface, such that the second metal layer 232*a* formed on the first metal layer 231*a* is anisotropically plated mainly in the height direction.

Likewise, for the right surface of the outermost pattern 220*b*, plating in the width direction is suppressed by the adjacent intermediate pattern 220*c*, and for the left surface, i.e., the outer surface, plating in the width direction is suppressed by the first insulating pattern 241 bonded to the outer surface, such that the first metal layer 231*b* is anisotropically plated mainly in the height direction.

Further, for the second metal layer 232*b* formed on the surface of the first metal layer 231*b*, plating in the width direction is suppressed by the adjacent first metal layer pattern 231*c* on the right surface of the first metal layer 231*b*, and plating in the width direction is suppressed by the second insulating patterns 242 bonded to the outer surface on the left surface, i.e., the inner surface, such that the second metal layer 232*b* formed on the first metal layer 231*b* is anisotropically plated mainly in the height direction.

As described above, in the power conductor according to the exemplary embodiment of the present invention, even in the case that metal layers are repeatedly plated, insulating patterns are formed on both sides of the repeatedly plated metal layers, such that the innermost pattern and the outermost pattern may have similar aspect ratio with the intermediate patterns. Accordingly, the performance of the power inductor is greatly improved.

Hereinafter, a manufacturing method of a power inductor according to an exemplary embodiment of the present invention will be described.

FIGS. 5 to 8 are diagrams for sequentially illustrating the processes of the manufacturing method of a power inductor according to the present invention. First, referring to FIG. 5, coil patterns 120 are formed on one surface or both surfaces of a core insulating layer 110. This may be performed by any one of a subtractive process, an additive process, a semi-additive process and a modified semi-additive process. Accordingly, although not shown in the drawings, seed layers for preprocessing electrolyte plating according to a plating process may be present under the coil patterns 120.

Then, as shown in FIG. 6, insulating patterns 140 are formed that are bonded to at least one of the innermost pattern 120*a* and outermost pattern 120*b* of the coil patterns 120.

Specifically, the insulating pattern 140 bonded to the innermost pattern 120*a* is formed on the inner surface of the innermost pattern 120*a*, whereas the insulating pattern 140 bonded to the outermost pattern 120*b* is formed on the outer surface of the outermost pattern 120*b*.

Further, when plating metal layers in the later process, in order to prevent the metal layers from being overly plated to the side of the insulating patterns 140, it is desired that the insulating pattern 140 formed on the inner surface of the innermost pattern 120*a* be extended to the upper surface of the innermost pattern 120*a*. For the same reason, it is desired that the insulating pattern 140 formed on the outer surface of the outermost pattern 120*b* be extended to the upper surface of the outermost pattern 120*b*.

Then, as shown in FIG. 7, metal layers 130 are plated on the surface of the coil patterns 120. This may be performed though the process using the coil patterns 120 as lead-in lines.

Specifically, by performing electrolyte plating using the coil patterns 120 as lead-in lines, plating in the width direction is suppressed by the adjacent patterns for the intermediate patterns 120_c_, and thereby the metal layers 130_c_ are anisotropically plated mainly in the height direction.

Further, for the left surface of the innermost pattern 120_a_, plating in the width direction is suppressed by the adjacent intermediate pattern 120_c_, and for the right surface, i.e., the inner surface, plating in the width direction is suppressed by the insulating patterns 140 bonded to the inner surface, such that the metal layer 130_a_ is anisotropically plated mainly in the height direction.

Likewise, for the right surface of the outermost pattern 120_b_, plating in the width direction is suppressed by the adjacent intermediate pattern 120_c_, and for the left surface, i.e., the outer surface, plating in the width direction is suppressed by the insulating patterns 140 bonded to the outer surface, such that the metal layer 130_b_ is anisotropically plated mainly in the height direction.

Finally, after the metal layers 130 are plated, as shown in FIG. 8, an insulator 150 is formed that covers the coil patterns 120 including the metal layers 130, to complete a power inductor according to the present invention.

As stated above, unlike the existing coil pattern, according to the present invention, the innermost coil pattern and the outermost coil pattern also have similar shapes with the intermediate coil patterns, such that areas of the metal-polymer filled in the innermost coil pattern and the outermost coil pattern are increased. By doing so, the performance (inductance) of the power inductor is improved and low direct current resistance is achieved.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A power inductor comprising:

coil patterns formed on one surface or both surfaces of a core insulating layer and comprising an innermost pattern, one or more intermediate patterns, and an outermost pattern on each surface;

one or more insulating patterns bonded to at least one side surface of at least one of the innermost pattern and the outermost pattern of the coil patterns, wherein the at least one side surface bonded to the insulating patterns is nonadjacent to any side surface of the intermediate patterns, which are not bonded to the insulating patterns;

metal layers plated on surfaces of the coil patterns, including on one or both side surfaces of one or more of the intermediate patterns, wherein a thickness of plating on upper surfaces of the coil patterns is greater than that on side surfaces of the coil patterns; and an insulator covering the metal layers.

2. The power inductor according to claim 1, wherein the insulating pattern bonded to the innermost pattern is formed on an inner surface of the innermost pattern; and the insulating pattern bonded to the outermost pattern is formed on an outer surface of the outermost pattern.

3. The power inductor according to claim 2, wherein the insulating pattern bonded to the inner surface of the innermost pattern is extended to an upper surface of the innermost pattern.

4. The power inductor according to claim 2, wherein the insulating pattern bonded to the outer surface of the outermost pattern is extended to an upper surface of the outermost pattern.

5. The power inductor according to claim 1, wherein the metal layers are anisotropically plated through the plating process using the coil patterns as lead-in lines.

6. A power inductor comprising:

coil patterns formed on one surface or both surfaces of a core insulating layer and comprising an innermost pattern, one or more intermediate patterns, and an outermost pattern on each surface;

one or more first insulating patterns bonded to at least one side surface of at least one of the innermost pattern and the outermost pattern of the coil patterns, wherein the at least one side surface bonded to the first insulating patterns is nonadjacent to any side surface of the intermediate patterns, which are not bonded to the first insulating patterns;

one or more first metal layers plated on surfaces of the coil patterns, including on one or both side surfaces of one or more of the intermediate patterns, wherein a thickness of plating on upper surfaces of the coil patterns is greater than that on side surfaces of the coil patterns;

one or more second insulating patterns bonded to at least one side surface of at least one of an innermost and an outermost metal patterns of the first metal layers each plated on the innermost pattern and the outermost pattern, wherein the at least one side surface bonded to the second insulating patterns is nonadjacent to any side surface of an intermediate metal pattern of the first metal layers plated on the intermediate patterns;

second metal layers plated on surfaces of the first metal layers; and an insulator covering the second metal layers.

7. The power inductor according to claim 6, wherein the first insulating pattern bonded to the innermost pattern is formed on an inner side surface of the innermost pattern; and the second insulating pattern bonded to an innermost first metal layer plated on the surface of the innermost pattern is formed on an inner side surface of the innermost first metal layer.

8. The power inductor according to claim 6, wherein the first insulating pattern bonded to the outermost pattern is formed on an outer side surface of the outermost pattern; and the second insulating pattern bonded to an outermost first metal layer plated on the surface of the outermost pattern is formed on an outer surface of the outermost first metal layer.

* * * * *